United States Patent
Zhang et al.

(10) Patent No.: US 10,924,307 B1
(45) Date of Patent: Feb. 16, 2021

(54) CONTINUOUS TIME LINEAR EQUALIZATION CIRCUIT WITH PROGRAMMABLE GAINS

(71) Applicant: NXP B.V., Eindhoven (NL)

(72) Inventors: Xu Zhang, Chandler, AZ (US); Siamak Delshadpour, Phoenix, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/876,691

(22) Filed: May 18, 2020

(51) Int. Cl.
 *H04L 25/03* (2006.01)
 *H03K 17/687* (2006.01)
 *H03K 17/60* (2006.01)

(52) U.S. Cl.
 CPC ....... *H04L 25/03878* (2013.01); *H03K 17/60* (2013.01); *H03K 17/687* (2013.01); *H04L 25/03012* (2013.01)

(58) Field of Classification Search
 None
 See application file for complete search history.

(56) References Cited

U.S. PATENT DOCUMENTS

| | | | | |
|---|---|---|---|---|
| 5,384,501 A * | 1/1995 | Koyama | ................ | G06G 7/184 327/336 |
| 5,514,950 A * | 5/1996 | Sevenhans | ............ | H03F 1/3211 323/312 |
| 5,677,646 A * | 10/1997 | Entrikin | ................ | H03F 1/3211 330/149 |
| 6,819,166 B1 | 11/2004 | Choi et al. | | |
| 7,532,070 B2 * | 5/2009 | Cowley | ..................... | H03F 1/26 330/254 |
| 7,804,356 B2 * | 9/2010 | Gomez | .................. | H03G 3/001 330/2 |
| 8,391,349 B1 | 3/2013 | Khalili | | |
| 8,604,879 B2 * | 12/2013 | Mourant | ............... | H03F 1/3211 330/260 |
| 8,885,691 B1 | 11/2014 | Ren et al. | | |

(Continued)

OTHER PUBLICATIONS

U.S. Appl. No. 16/876,970, filed May 18, 2020, entitled: Continuous Time Linear Equalization Circuit. The Examiner is referred to the copending patent prosecution of the common Applicant (no attachment).

(Continued)

*Primary Examiner* — Thomas J. Hiltunen
(74) *Attorney, Agent, or Firm* — Rajeev Madnawat

(57) ABSTRACT

A continuous time linear equalization (CTLE) circuit is disclosed. The CTLE circuit includes an input port, an output port, a first differential transistor pair coupled to the input port and the output port and a second differential transistor pair. The CTLE circuit further includes a first degenerative impedance circuit coupled between the first differential transistor pair and ground. The first degenerative impedance includes switchable components to vary impedance of the first degenerative impedance circuit. The CTLE circuit also includes a second degenerative impedance circuit coupled between the second differential transistor pair and ground. The second degenerative impedance includes switchable components to vary impedance of the second degenerative impedance circuit, wherein the resistive part of the impedance of the first degenerative impedance circuit is equal to the impedance of the second degenerative impedance circuit.

18 Claims, 3 Drawing Sheets

(56) References Cited

U.S. PATENT DOCUMENTS

| | | | |
|---|---|---|---|
| 9,172,566 | B1 | 10/2015 | Li et al. |
| 9,374,217 | B1 | 6/2016 | Forey et al. |
| 9,473,330 | B1 | 10/2016 | Francese |
| 9,602,314 | B1 | 3/2017 | Chang et al. |
| 9,654,310 | B1 | 5/2017 | Chang |
| 9,705,708 | B1 | 7/2017 | Jin et al. |
| 9,917,607 | B1 | 3/2018 | Zhang et al. |
| 9,954,503 | B2 * | 4/2018 | Arai ............... H03G 1/0029 |
| 10,263,815 | B1 * | 4/2019 | Geary ............ H03F 3/45197 |
| 10,447,507 | B1 | 10/2019 | Zhang et al. |
| 2008/0101450 | A1 | 5/2008 | Wu et al. |
| 2011/0235695 | A1 | 9/2011 | Lin |
| 2011/0317751 | A1 | 12/2011 | Roethig et al. |
| 2016/0173289 | A1 | 6/2016 | Smith |
| 2016/0173299 | A1 | 6/2016 | Islam |

OTHER PUBLICATIONS

U.S. Appl. No. 16/876,854, filed May 18, 2020, entitled: High Bandwidth Continuous Time Linear Equalization Circuit. The Examiner is referred to the copending patent prosecution of the common Applicant (no attachment).

Liu, H. et al. "An HDMI Cable Equalizer With Self-Generated Energy Ratio Adaptation Scheme", IEEE Transactions on Circuits and Systems—II: Express Briefs, vol. 56, No. 7, pp. 595-599 (Jul. 2009).

Zhang, G. E. et al. "A 10 Gb/s BiCMOS Adaptive Cable Equalizer", IEEE Journal of Solid-State Circuits, vol. 40, No. 11, pp. 2132-2140 (Nov. 2005).

Lee, J. "A 20-Gb/s Adaptive Equalizerin 0.13-μm CMOS Technology" IEEE Journal of Solid-State Circuits, vol. 41, No. 9, pp. 2058-2066 (Sep. 2006).

Gondi, S. et al. "Equalization and Clock and Data Recovery Techniques for 10-Gb/s CMOS Serial-Link Receivers", IEEE Journal of Solid-State Circuits, vol. 42, No. 9, pp. 1999-2011 (Sep. 2007).

Liu, H. et al. "A 5-Gb/s Serial-Link Redriver With Adaptive Equalizer and Transmitter Swing Enhancement", IEEE Transactions on Circuits and Systems—1: Regular Papers, vol. 61, No. 4, pp. 1001-1011 (Apr. 2014).

Sahni, P. S. et al. "An Equalizer With Controllable Transfer Function for 6-Gb/s HDMI and 5.4-Gb/s DisplayPort Receivers in 28-nm UTBB-FDSOI", IEEE Transactions on Very Large Scale Integration (VLSI) Systems, vol. 24, No. 8, pp. 2803-2807 (Aug. 8, 2016).

Rahman, W. et al "A 22 5-to-32-Gb/s 3.2pJ/b Referencesless Baud-Rate Digital CDR with DFE and CTLE in 28nm CMOS", IEEE International Solid-State Circuits Conference, pp. 120-121 (2017).

Depaoli, E. et al. "A 64 Gb/s Low-Power Transceiver for Short-Reach PAM-4 Electrical Links in 28-nm FDSOI CMOS", IEEE Journal of Solid-State Circuits, vol. 54, No. 1, pp. 6-17 (Jan. 2019).

Non-Final Rejection for U.S. Appl. No. 16/876,854, 14 pgs. (dated Jan. 6, 2021).

* cited by examiner

CONTINUOUS TIME LINEAR EQUALIZATION CIRCUIT WITH PROGRAMMABLE GAINS

BACKGROUND

Wired communication refers to the transmission of data over a wire-based communication technology. In general, wired communications are considered to be the most stable of all types of communications services. Wide band wired data communication systems such as universal serial bus (USB), high-definition multimedia interface (HDMI), DisplayPort (DP), Peripheral Component Interconnect Express (PCIe), Thunderbolt, Converged Input Output (CIO) and any other high-speed wide band wired communication require stages of processing within their electronic circuitry. Wide band data communications system circuitry can include several stages including modules to equalize, amplify and/or re-drive signals for every data channel. Usually one stage cannot provide enough gain or equalization. In such multi-stage systems, the use of intermediate buffers between each stage may be necessary. Oftentimes, however, the buffer consumes even more power than the equalizer, amplifier and drivers, which makes a design with less buffer blocks more favorable in the system, especially for use in low voltage (i.e., ~1.8V or lower) systems. What are needed is an efficient a continuous time linear equalization circuit (CTLE).

SUMMARY

In one embodiment, a continuous time linear equalization (CTLE) circuit is disclosed. The CTLE circuit includes an input port, an output port, a first differential transistor pair coupled to the input port and the output port and a second differential transistor pair. The CTLE circuit further includes a first degenerative impedance circuit coupled between the first differential transistor pair and ground. The first degenerative impedance includes switchable components to vary impedance of the first degenerative impedance circuit. The CTLE circuit also includes a second degenerative impedance circuit coupled between the second differential transistor pair and ground. The second degenerative impedance includes switchable components to vary impedance of the second degenerative impedance circuit, wherein the resistive part of the impedance of the first degenerative impedance circuit is equal to the impedance of the second degenerative impedance circuit.

In another embodiment, a continuous time linear equalization (CTLE) circuit is disclosed. The CTLE circuit includes an input port, an output port, a first differential transistor pair coupled to the input port, a second differential transistor pair coupled to the input and the output port, a third differential transistor pair coupled to the input port and the output port, and a forth differential transistor pair coupled to the input and the output port. The CTLE further includes a first degenerative impedance circuit coupled between emitters or sources the first differential transistor pair and emitters or sources the forth differential transistor pair. The first degenerative impedance includes switchable components to vary impedance of the first degenerative impedance circuit. The CTLE also includes a second degenerative impedance circuit coupled between emitters or sources the second differential transistor pair and emitters or sources the third deferential transistor pair. The second degenerative impedance includes switchable components to vary impedance of the second degenerative impedance circuit, wherein the resistive part of the impedance of the first degenerative impedance circuit is equal to the impedance of the second degenerative impedance circuit.

In some examples, the emitters or sources of the first, second, third and fourth differential transistor pairs are coupled with ground via current sinks/sources and the first and the second degeneration impedance are configured such that total current passing through each of the emitters or sources of the first, second, third and fourth differential transistor pairs and ground is constant.

In some examples, the switchable components in the first generative impedance and the switchable components in the second degenerative impedance are configured to be driven such that a value of a resistive part of the first degeneration impedance and a value of the resistive part of the second degeneration impedance are equal.

In some embodiments, the second degeneration impedance is a second or third order degeneration impedance including a capacitor, a resistor and an inductor and the first degeneration impedance circuit includes a plurality of resistors coupled in parallel with each other. Each of the plurality of resistors is coupled with an externally controllable switch to electrically remove the each of the plurality of resistors from the first degeneration impedance circuit. The second degeneration impedance circuit includes a plurality of resistors coupled in parallel with each other. Each of the plurality of resistors is coupled with an externally controllable switch to electrically remove the each of the plurality of resistors from the second degeneration impedance circuit.

In some examples, the first degeneration impedance circuit and the second degeneration impedance circuit include equal number of switchable resistors. The switchable components of the first degeneration impedance circuit and the switchable components of the second degeneration impedance circuit are driven by a same control signal.

In some examples, the switchable components of the first and second degenerative impedance circuits are operable by a control signal including a plurality of control lines equal to a number switchable components in the first degeneration impedance circuit. The control signal is used to control the DC gain of the CTLE.

The CTLE is configured such that the total of currents passing through the first degeneration impedance circuit and the second degeneration impedance circuit remain constant irrespective of status of the switchable components in the first and second degeneration impedances.

BRIEF DESCRIPTION OF THE DRAWINGS

Throughout the description, similar reference numbers may be used to identify similar elements.

DETAILED DESCRIPTION

Figure 1:
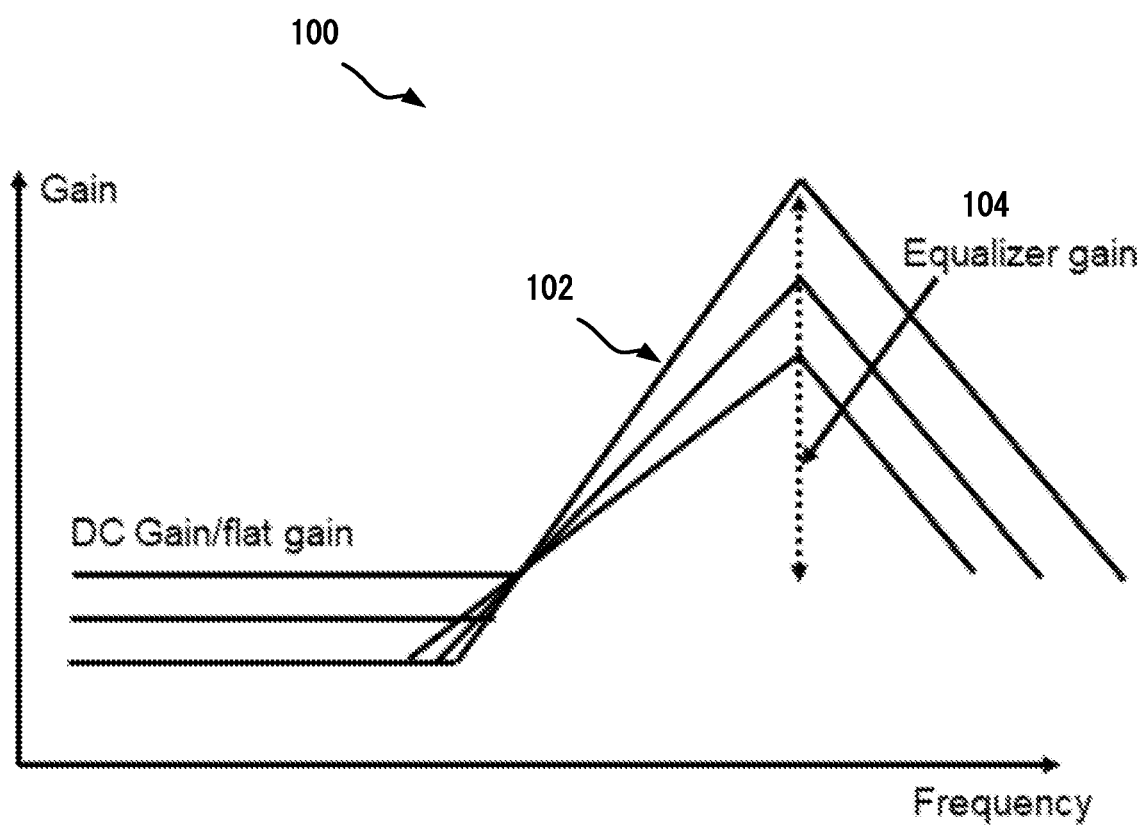
FIG. 1 shows a frequency response of the continuous time linear equalization (CTLE) circuit.

It will be readily understood that the components of the embodiments as generally described herein and illustrated in the appended Figs. could be arranged and designed in a wide variety of different configurations. Thus, the following more detailed description of various embodiments, as represented in the Figs., is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Embodiments herein describes a continuous time linear equalizer (CTLE) with programmable DC and equalizer gains for high speed wired data communication. The equalizer has independent controls of DC and equalizer gains. The equalizer gain is programmable by adjusting the weights of two signal paths via controlling the input DC bias of the equalizer. One of the two signal paths has a maximum peaking gain and the other has a minimum. The DC/flat gain, on the other hand, is adjusted by switching on/off the resistor elements in the emitter/source degeneration resistor bank. The equalizer features a single stage design. As a result, it exhibits a low noise and low power operation with minimized layout area. Among others, the embodiments described herein may be used in a Universal Serial Bus (USB) system, a DisplayPort (DP) system, a PCIe (Peripheral Component Interconnect Express) system, a Thunderbolt system, or another communications system or any other wired high-speed communication standards.

As data rate increases, high speed CTLE with programmable DC and equalizer gain becomes important in the communication system in order to support various communication channels, e.g., microstrip, coaxial cable with different lengths. However, traditional CTLE can only change its equalizer gain, defined as the gain difference between the maximum gain across the frequency and the DC gain (low frequency output gain), by varying its DC gain. This needs additional gain stage to adjust the DC gain to the target value. The CTLE described herein avoids need for an extra gain stage and provides all the programmability in one stage is good for low noise and low power applications.

Figure 2:
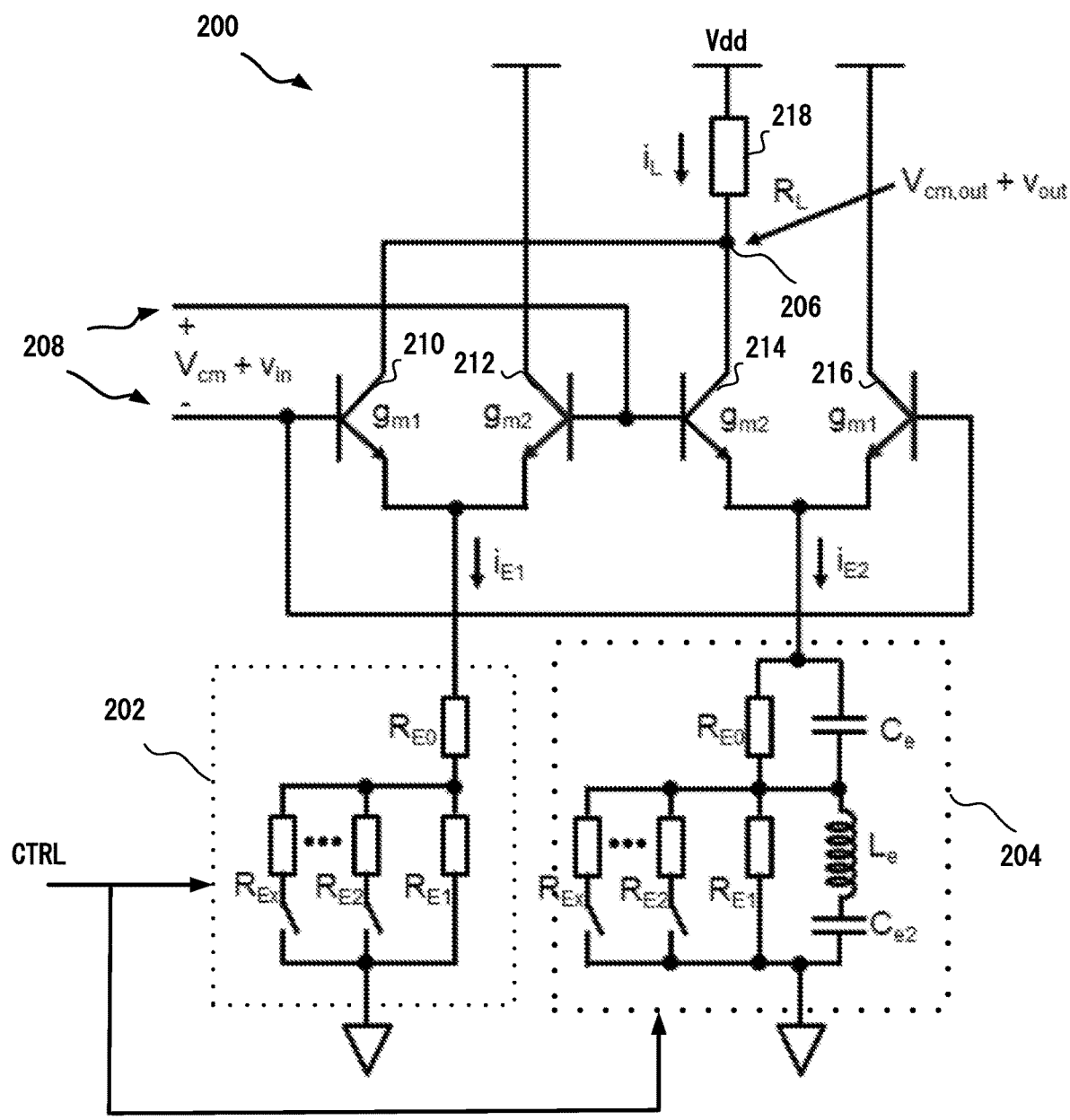
FIG. 2 shows a circuit diagram of the CTLE circuit in accordance with one or more embodiments.
Figure 3:
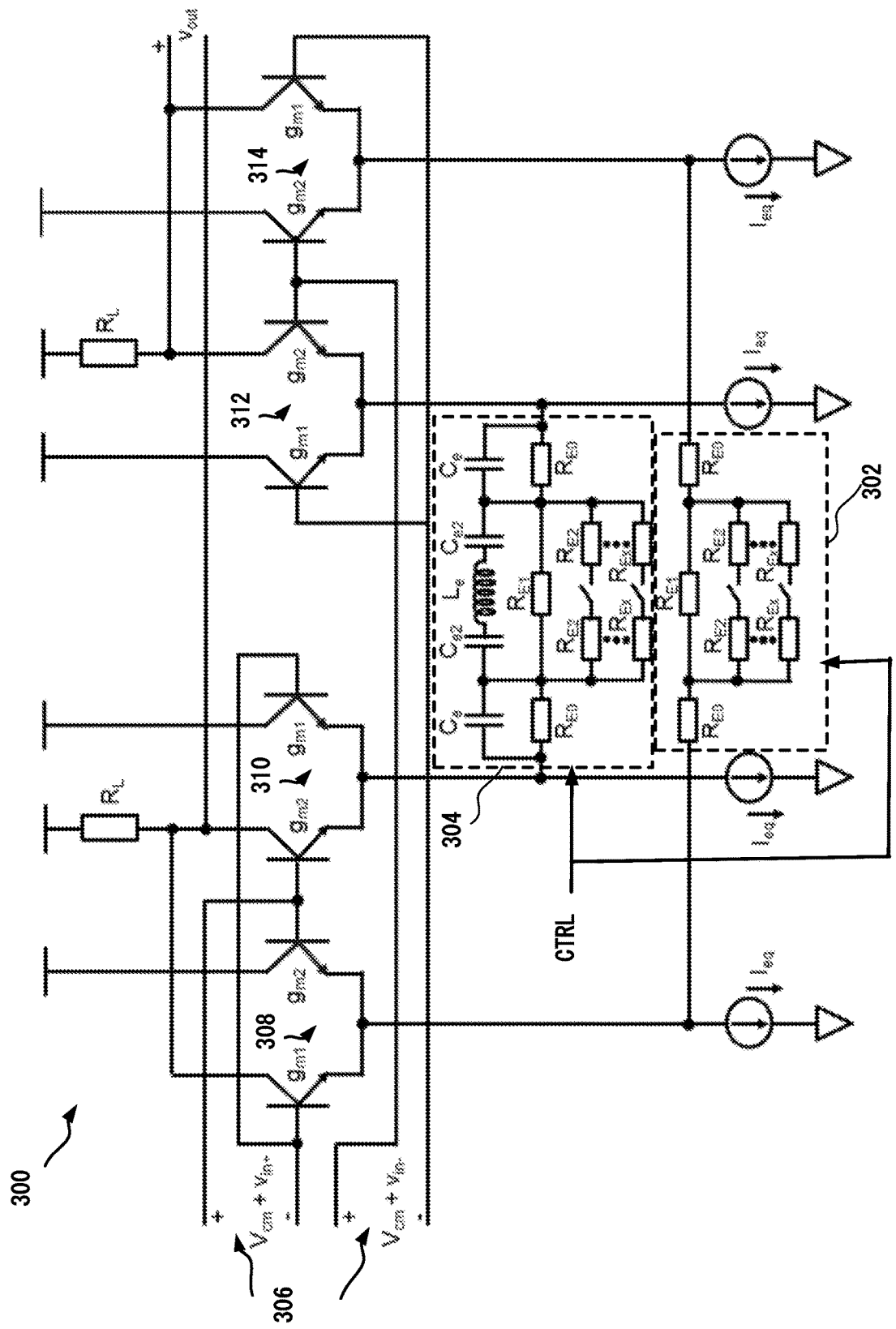
FIG. 3 depicts a circuit diagram of a fully differential CTLE circuit in accordance with one or more embodiments.

FIG. 1 shows a frequency response curve 100 of the CTLE described in FIGS. 2 and 3. Equalizer gain 104 of the CTLE is defined as the gain difference between the maximum gain and the DC gain of the CTLE. A conventional CTLE changes its equalizer gain by varying its DC gain, therefore requiring an additional programmable gain stage to control the total DC gain. The embodiments of the CTLE described herein change its DC gain 102 independent from the equalizer gain in a single stage, as the equalizer gain is controlled by changing the peaking gain.

FIG. 2 shows a single-ended implementation of the CTLE 200. The CTLE 200 includes an impedance $R_L$, which can be a complex impedance or a resistive impedance. One terminal of $R_L$ is coupled with the supply/ground and the current flowing through $R_L$ is represented by $i_L$. The CTLE 200 includes two transistor pairs, each pair including transistors $g_{m1}$ and $g_{m2}$. The CTLE 200 includes two emitter degeneration impedances 202, 204. The first degeneration impedance 202 includes a resistor $R_{E0}$. The first degeneration impedance 202 also includes a plurality of resistors $R_{E1}$, $R_{E2}$ ... $R_{EX}$ coupled with each other in parallel. Each of the resistors $R_{E2}$ ... $R_{EX}$ is coupled to ground via a switch. In some examples, the resistor $R_{E1}$ may also be coupled with ground via a switch. However, in some embodiments, the resistor $R_{E1}$ may be coupled with ground without a switch in between. The resistor $R_{E0}$ is coupled with the parallel arrangement of the resistors $R_{E2}$ ... $R_{EX}$ in series. The second degeneration impedance 204 includes a same or similar structure of resistors as shows in the first degeneration impedance 202. However, a capacitor Ce may be coupled with the resistor $R_{E0}$ in parallel and a series of an inductor Le and a capacitor Ce2 may be coupled in parallel with the parallel resistors $R_{E2}$ ... $R_{EX}$. At an input terminal 208, the voltage is equal to an addition of the common mode voltage (or DC bias voltage Vcm) and an AC input voltage (Vin). At an output port 206, the voltage is an addition of output common mode voltage and AC output voltage. In some examples, the resistors denoted using a same identifier are same or substantially same in values. For example, $R_{E0}$ in the first degeneration impedance 202 may have the same values as $R_{E0}$ in the second degeneration impedance 204.

In the embodiment depicted in FIG. 2, the CTLE 200 receives an input signal, $V_{cm}+V_{in}$, at the input terminal 208, and outputs an output signal at an output terminal 206. The input signal includes a direct current (DC) component or bias, $V_{cm}$, and an input data signal component, $V_{in}$, which may be, for example, a high speed input signal component. The DC component, $V_{cm}$, of the input signal has both positive and negative polarities. In an embodiment, the extremes of positive and negative polarities are set by the maximum available current passing through the first and second set of transistors 210, 212, 214, 216. The peaking gain of the CTLE 200 (i.e., the highest amplitude of the gain curve of the linear equalizer) is programmable by adjusting the DC component, $V_{cm}$ that is received at input terminal 208 of the CTLE 200 and that is applied to the first and second sets of transistors 210, 212, 214, 216. The output signal includes a DC component or bias, $V_{cm,out}$, and an output data signal component, $V_{out}$. In some embodiments, the CTLE 200 is included in a continuous-time linear equalizer system that can attenuate low-frequency signal components of the input signal, $V_{cm}+V_{in}$, amplify components of the input signal, $V_{cm}+V_{in}$, around the Nyquist frequency, and filter off higher frequencies of the input signal, $V_{cm}+V_{in}$.

In some embodiments, transistors in each set of transistors 210, 212, 214, 216 have the same structures or are the same. In an embodiment, transistors in each set of transistors 210, 212, 214, 216 have the same type, have the same design specifications, have the same dimensions, and are made from the same substrate material with the same processing technology. For example, transistors in each set of transistors 210, 212, 214, 216 are made in bulk with an identical model number. In some embodiments, the transconductance, $g_{m1}$, is equivalent to the transconductance, $g_{m2}$. In the embodiment depicted in FIG. 2, gate terminals or base terminals of transistors in each set of transistors 210, 212, 214, 216 are connected together. Specifically, gate terminals or base terminals of the first set of transistors 210, 212 are connected together and are connected to the input terminal 208 while gate terminals or base terminals of the second set of transistors 214, 216 are connected together and are connected to the input terminal 208. In the embodiment depicted in FIG. 2, the peaking gain of the CTLE 200 is programmable by adjusting the DC component, $V_{cm}$, of the input signal such that the transconductance of at least one of the first and second sets of transistors 210, 212, 214, 216 is changed.

The resistor 218 is electrically connected to the supply voltage, Vdd, to the output terminal 206, and to the transistors 210, 214. The first and second degeneration impedance 202, 204 are electrically connected between the first and second sets of transistors 210, 212, 214, 216 and at least one fixed voltage (e.g., the ground). The first and second degeneration impedance 202, 204 may be electrically connected between emitter terminals or source terminals of the first and second sets of transistors 210, 212, 214, 216 and the fixed voltage (e.g., the ground). For example, if the first and second sets of transistors 210, 212, 214, 216 are implemented as bipolar junction transistors (BJTs), the first and second degeneration impedance 202, 204 are electrically connected between the emitter terminals of the first and second sets of transistors 210, 212, 214, 216 and the fixed voltage (e.g., the ground). In another example, if the first and second sets of transistors 210, 212, 214, 216 are implemented as field-effect transistors (FETs), the first and second degeneration impedance 202, 204 are electrically connected between the source terminals of the first and second sets of transistors 210, 212, 214, 216 and the ground.

The resistors $R_{E0}$, $R_{E1}$, $R_{E2}$, . . . , $R_{Ex}$ of the two impedances 202, 204 are matched at all time. In some examples, the switch coupled with $R_{E1}$ in both impedances 202, 204 are controlled by a same control signal (CTRL). Similarly, the switch coupled with $R_{E2}$ in both impedances 202, 204 are controlled by a same signal (CTRL). The control signal CTRL may include multi-lines, equal to the number of switches in the degenerative impedance circuit 202 and each line driving two switches, e.g., one line may drive the switch coupled with $R_{E2}$ in the two impedances 202, 204. For example, both impedances 202, 204 may have a same number of switchable resistors $R_{E2}$. $R_{EX}$ and a switch configured to connect or disconnect a particular resistor (e.g., $R_{E2}$) in the impedance 202 and a switch configured to connect or disconnect a particular resistor (e.g., $R_{E2}$) in the impedance 204 are controlled by a same signal. Accordingly, if the resistor $R_{E2}$ in the impedance 202 is connected to ground at time T, the resistor $R_{E2}$ in the impedance 204 is also connected to ground at time T. In another example, the first degeneration impedance 202 and the second degeneration impedance 204 are configured such that the resistive impedance part remains the same at time T, in the first degeneration impedance 202 and the second degeneration impedance 204. The total of the two currents iE1, iE2 passing through the first degeneration impedance 202 and the second degeneration impedance is constant. Through the switchable resistive components in the impedance 202 and the impedance 204, the CTLE 200 can change its DC gain independent of its equalizer gain. The DC gain of the CTLE 200 is controlled by switching on/off the resistor elements in the first degeneration impedance 202 and/or the second degeneration impedance 204. In some example, an external controller (not shown) may be used to drive the switches in the first degeneration impedance 202 and the second degeneration impedance 204. On the other hand, the equalizer gain of the CTLE 200 is controlled by the DC bias (Vcm) of the input. The currents iE1 or iE2 vary when Vcm is varied. The signal output content degenerated by the first degeneration impedance 202 in the iE1 path has zero or minimum peaking gain. The output content degenerated by the second degeneration impedance 204 in the iE2 path has the maximum peaking gain. By controlling the percentage of iE1 or iE2 from the total of iE1 and iE2, the CTLE 200 can have an equalizer gain between minimum and maximum equalizer gain achieved by the two paths (e.g., the path including the first degeneration impedance 202 and the path including the second degeneration impedance 204).

FIG. 3 shows a fully differential CTLE 300. The CTLE 300 includes an input port 306. A biasing voltage $V_{cm}$ is applied to the input signal and the CTLE 300 produces $V_{out}$ at an output port. The fully differentially CTLE 300 is an electrical double of the CTLE 200. The CTLE 300 includes transistor pairs 308, 310, 312, 314. Therefore, the CTLE 300 includes four transistor pairs, each transistor pair includes transistors $g_{m1}$, $g_{m2}$. The bases of the transistors $g_{m1}$ in the transistor pairs 308, 310 are driven by a same first end of the first input signal and the bases of the transistors $g_{m2}$ in the transistor pairs 308, 310 are driven by a same second end of the first input signal. Similarly, the bases of the transistors $g_{m1}$ in the transistor pairs 312, 314 are driven by a same first end of the second input signal and the bases of the transistors $g_{m2}$ in the transistor pairs 312, 314 are driven by a same second end of the second input signal. The emitters of the transistors $g_{m1}$, $g_{m2}$ in all transistor pairs 308, 310, 312, 314 are coupled with ground and the coupling path to ground carries a same current $I_{eq}$.

The CTLE 300 includes a first degeneration impedance 302 coupled between the emitters of the transistor pair 308 and the emitters of the transistor pair 314. The first degeneration impedance 302 includes resistors $R_{E0}$, $R_{E1}$, $R_{E0}$ in a series. The first degeneration impedance 302 also includes a pair of resistors coupled with each other via a switch. A plurality of such resistor pairs are coupled with the series of the resistors $R_{E0}$, $R_{E1}$, $R_{E0}$ in parallel. The switches may be turned on and off to adjust the DC gain of the CTLE 300. The CTLE 300 also includes a second degeneration impedance 304. The second degeneration impedance 304 is similar in structure to the first degeneration impedance 302, except, a capacitor Ce is coupled in parallel with each of the $R_{E0}$ resistors. In some examples, the switch coupled with $R_{E1}$ in both impedances 302, 304 are controlled by a same control signal, CTRL that is described above. Similarly, the switch coupled with $R_{E2}$ in both impedances 302, 304 are controlled by a same signal. For example, both impedances 302, 304 may have a same number of switchable resistors $R_{E2}$. $R_{EX}$ and a switch configured to connect or disconnect a particular resistor (e.g., $R_{E2}$) in the impedance 302 and a switch configured to connect or disconnect a particular resistor (e.g., $R_{E2}$) in the impedance 304 are controlled by a same signal. Accordingly, if the resistor $R_{E2}$ in the impedance 302 is connected to ground at time T, the resistor $R_{E2}$ in the impedance 304 is also connected to ground at time T.

The CTLE 300 further includes a series of a capacitor Ce2, an inductor Le2 and a capacitor Ce2 (where the values of the component denoted using a same reference symbol are either same or substantially same). The series of Ce2, Le2, Ce2 is coupled with the resistor $R_{E1}$ in the second degeneration impedance 304. The second degeneration impedance is coupled between the emitters of the transistors of the transistor pair 310 and the transistor pair 312. The output port is coupled to the collector of the transistor $g_{m2}$ in the transistor pair 310 and the collector of the transistor $g_{m2}$ in the transistor pair 312. It may be noted that the BJTs shown in FIGS. 2 and 3 may be replaced with NMOS transistors. The CTLE 200 and the CTLE 300 discussed above are capable of adjusting DC gain independent from the equalizer gain, as shown in FIG. 1. Also the whole architecture can use CMOS PNP BJT instead of NPN BJTs which termination of the resistor 218 will be to ground. In this case PNP BJT can be replaced with PMOS transistors.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A continuous time linear equalization (CTLE) circuit, comprising:
   an input port;
   an output port;
   a first differential transistor pair coupled to the input port and the output port;
   a second differential transistor pair;
   a first degenerative impedance circuit coupled between the first differential transistor pair and ground, wherein the first degenerative impedance includes switchable components to vary impedance of the first degenerative impedance circuit; and
   a second degenerative impedance circuit coupled between the second differential transistor pair and ground, wherein the second degenerative impedance includes switchable components to vary impedance of the second degenerative impedance circuit, wherein the resistive part of the impedance of the first degenerative impedance circuit is equal to the impedance of the second degenerative impedance circuit, wherein the switchable components of the first degenerative impedance and the switchable components of the second degenerative impedance are controlled by a same control signal.

2. The CTLE circuit of claim 1, wherein the switchable components in the first generative impedance and the switchable components in the second degenerative impedance are configured to be driven such that a value of a resistive part of the first degeneration impedance and a value of the resistive part of the second degeneration impedance are equal.

3. The CTLE circuit of claim 1, wherein the second degeneration impedance is a second or third order degeneration impedance including a capacitor, a resistor and an inductor.

4. The CTLE circuit of claim 1, wherein the first degeneration impedance circuit includes a plurality of resistors coupled in parallel with each other.

5. The CTLE circuit of claim 4, wherein each of the plurality of resistors is coupled with an externally controllable switch to electrically remove the each of the plurality of resistors from the first degeneration impedance circuit.

6. The CTLE circuit of claim 1, wherein the second degeneration impedance circuit includes a plurality of resistors coupled in parallel with each other.

7. The CTLE circuit of claim 6, wherein each of the plurality of resistors is coupled with an externally controllable switch to electrically remove the each of the plurality of resistors from the second degeneration impedance circuit.

8. The CTLE circuit of claim 1, wherein the first degeneration impedance circuit and the second degeneration impedance circuit include equal number of switchable resistors.

9. The CTLE circuit of claim 1, wherein the switchable components of the first and second degenerative impedance circuits are operable by a control signal including a plurality of control lines equal to a number of switchable components in the first degeneration impedance circuit.

10. The CTLE circuit of claim 9, further configured to vary DC gain through the control signal.

11. The CTLE circuit of claim 1, wherein a total of currents passing through the first degeneration impedance circuit and the second degeneration impedance circuit remain constant irrespective of status of the switchable components in the first and second degeneration impedances.

12. A continuous time linear equalization (CTLE) circuit, comprising:
    an input port;
    an output port;
    a first differential transistor pair coupled to the input port;
    a second differential transistor pair coupled to the input and the output port;

a third differential transistor pair coupled to the input port and the output port;

a fourth differential transistor pair coupled to the input and the output port;

a first degenerative impedance circuit coupled between emitters or sources of the first differential transistor pair and emitters or sources of the fourth differential transistor pair, wherein the first degenerative impedance includes switchable components to vary impedance of the first degenerative impedance circuit; and a second degenerative impedance circuit coupled between emitters or sources of the second differential transistor pair and emitters or sources of the third deferential transistor pair, wherein the second degenerative impedance includes switchable components to vary impedance of the second degenerative impedance circuit, wherein the resistive part of the impedance of the first degenerative impedance circuit is equal to the impedance of the second degenerative impedance circuit, wherein the switchable components of the first degenerative impedance and the switchable components of the second degenerative impedance are controlled by a same control signal.

13. The CTLE circuit of claim 12, wherein the second degeneration impedance is a second or third order degeneration impedance including a capacitor, a resistor and an inductor.

14. The CTLE circuit of claim 12, wherein the first degeneration impedance circuit includes a plurality of resistors coupled in parallel with each other.

15. The CTLE circuit of claim 14, wherein each of the plurality of resistors is coupled with an externally controllable switch to electrically remove the each of the plurality of resistors from the first degeneration impedance circuit.

16. The CTLE circuit of claim 12, wherein the second degeneration impedance circuit includes a plurality of resistors coupled in parallel with each other, wherein the first degeneration impedance circuit and the second degeneration impedance circuit include equal number of switchable resistors.

17. The CTLE circuit of claim 16, wherein each of the plurality of resistors is coupled with an externally controllable switch to electrically remove the each of the plurality of resistors from the second degeneration impedance circuit.

18. The CTLE circuit of claim 12, wherein the emitters or sources of the first, second, third and fourth differential transistor pairs are coupled with ground via current sinks/sources and the first and the second degeneration impedance are configured such that total current passing through each of the emitters or sources of the first, second, third and fourth differential transistor pairs and ground is constant.

* * * * *